(12) United States Patent
Anzai

(10) Patent No.: US 6,898,722 B2
(45) Date of Patent: May 24, 2005

(54) PARALLEL DATA TRANSFER METHOD AND SYSTEM OF DDR DIVIDED DATA WITH ASSOCIATED TRANSFER CLOCK SIGNAL OVER THREE SIGNAL LINES

(75) Inventor: Takeshi Anzai, Saitama (JP)

(73) Assignee: NEC Corporation, Tokyo (JP)

( * ) Notice: Subject to any disclaimer, the term of this patent is extended or adjusted under 35 U.S.C. 154(b) by 655 days.

(21) Appl. No.: 09/790,938

(22) Filed: Feb. 22, 2001

(65) Prior Publication Data

US 2001/0015923 A1 Aug. 23, 2001

(30) Foreign Application Priority Data

Feb. 22, 2000 (JP) ........................................ 2000-043849

(51) Int. Cl.⁷ .............................................. G06F 1/04
(52) U.S. Cl. ........................ 713/500; 713/502; 713/600
(58) Field of Search ............................... 713/500, 502, 713/600

(56) References Cited

U.S. PATENT DOCUMENTS

| | | | | | |
|---|---|---|---|---|---|
| 4,225,752 A | * | 9/1980 | Looschen | ................... | 398/154 |
| 4,621,341 A | | 11/1986 | New | | |
| 4,782,481 A | * | 11/1988 | Eaton | ........................ | 370/438 |
| 5,341,405 A | * | 8/1994 | Mallard, Jr. | ................ | 375/376 |
| 6,076,160 A | * | 6/2000 | Wisor | ............................. | 713/1 |
| 6,078,546 A | * | 6/2000 | Lee | ............................. | 365/233 |
| 6,480,498 B1 | * | 11/2002 | Gaudet et al. | .............. | 370/402 |

FOREIGN PATENT DOCUMENTS

| | | |
|---|---|---|
| EP | 0 434 083 A | 6/1991 |
| JP | 111 8951 A | 5/1989 |
| JP | 4144310 A | 5/1992 |

* cited by examiner

Primary Examiner—Lynne H. Browne
Assistant Examiner—Tse Chen
(74) Attorney, Agent, or Firm—Scully, Scott, Murphy & Presser

(57) ABSTRACT

A data transfer method allowing improved data transfer speed without increasing the number of signal lines is disclosed. After dividing data to be transferred into odd-numbered data and even-numbered data, the odd-numbered data are sequentially read at timing of a leading edge of each clock pulse and the even-numbered data are sequentially read at timing of a trailing edge of each clock pulse. Thereafter, a data transfer completion indicator is appended to one of the odd-numbered and even-numbered data strings. A transfer clock signal includes a fixed-level pulse in a period of time corresponding to the data transfer completion indicator. The one of the odd-numbered and even-numbered data strings followed by the data transfer completion indicator, the other of the odd-numbered and even-numbered data strings, and the transfer clock signal are transferred through different signal lines.

13 Claims, 6 Drawing Sheets

FIG.1
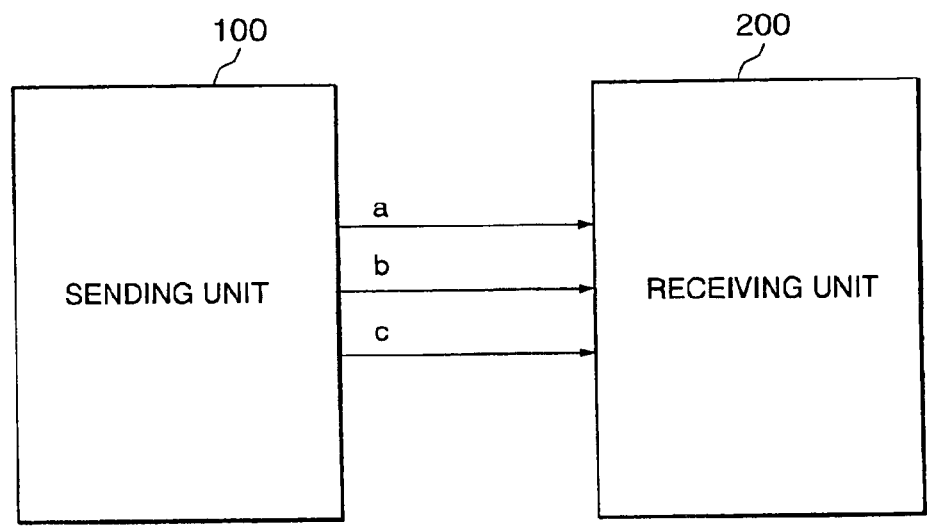
FIG.2A  a 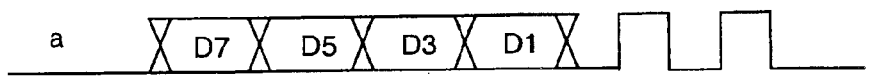
FIG.2B  b 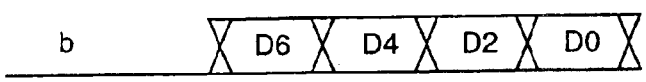
FIG.2C  c 
→ TIME FIG.6
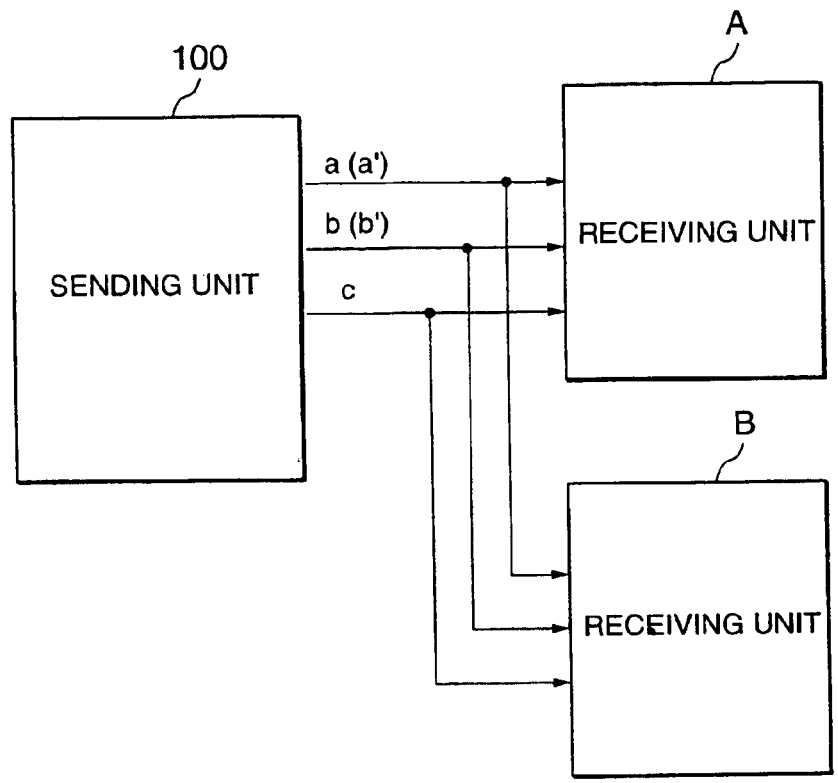
FIG.7A  a'
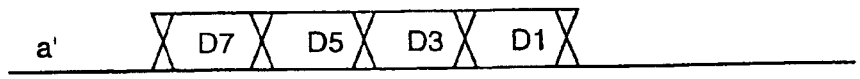
FIG.7B  b'
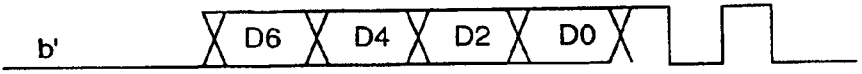
FIG.7C  c
→ TIME

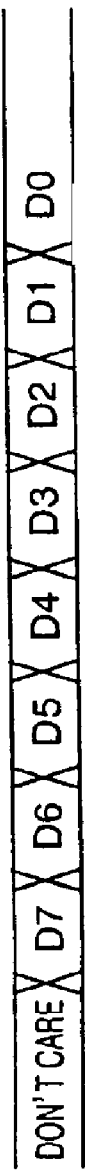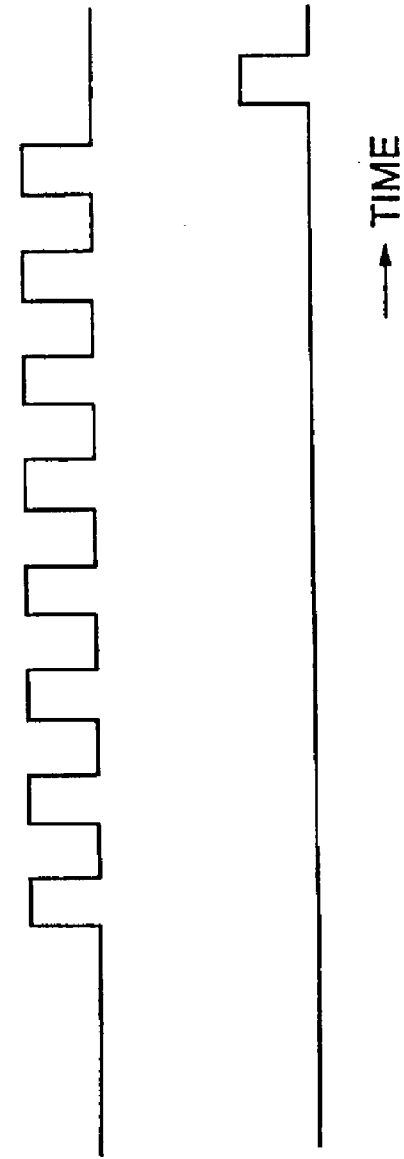
FIG.8A (PRIOR ART)
FIG.8B (PRIOR ART)
FIG.8C (PRIOR ART)

US 6,898,722 B2

PARALLEL DATA TRANSFER METHOD AND SYSTEM OF DDR DIVIDED DATA WITH ASSOCIATED TRANSFER CLOCK SIGNAL OVER THREE SIGNAL LINES

BACKGROUND OF THE INVENTION

1. Field of the Invention

The present invention relates to data transfer techniques and in particular to a data transfer method and system allowing improved data transfer speed without increasing the number of signal lines.

2. Description of the Related Art

In an apparatus that is required to have light weight and a small size, it is desirable to decrease the number of terminals of a large-scale integrated circuit (LSI), from the viewpoint of installation. For this purpose, a serial data interface has been used to transfer data between two LSIs. One-bit data transfer per one system clock is a maximum data transfer speed at the serial data interface.

In the case of transferring eight-bit data of D0 to D7 as shown in FIG. 8A from a sending LSI to a receiving LSI by using a serial data interface, for example, three signal lines are necessary in total including a data line, a serial clock line for transferring a serial clock signal shown in FIG. 8B, and a strobe signal line for a strobe signal shown in FIG. 8C. In this case, it is necessary to take time required for outputting eight serial clock pulses and the strobe signal. This has a problem in that the data transfer speed is slow.

SUMMARY OF THE INVENTION

The present invention has been made to solve the above problem. It is, therefore, an object of the present invention to provide a data transfer method and a data transfer system capable of improving the data transfer speed in serial transmission without increasing the number of signal lines.

According to an aspect of the present invention, a method for transferring data from a sending unit to a receiving unit, includes the steps of: dividing the data into first data and second data to store the first data and the second data; sequentially reading the first data at timing of a leading edge of each clock pulse of a reference clock signal to produce a first data string; sequentially reading the second data at timing of a trailing edge of each clock pulse of the reference clock signal to produce a second data string; appending a data transfer completion indicator to one of the first and second data strings; generating a transfer clock signal from the reference clock signal, wherein the transfer clock signal includes a fixed-level pulse in a period of time corresponding to the data transfer completion indicator; and transferring the one of the first and second data strings followed by the data transfer completion indicator, the other of the first and second data strings, and the transfer clock signal through different signal lines.

According to another aspect of the present invention, in a method for transferring data from a sending unit to a selected one of two receiving units connected in common to the sending unit, the sending unit divides the data into first data and second data to store the first data and the second data; sequentially reads the first data at timing of a leading edge of each clock pulse of a reference clock signal to produce a first data string; sequentially reads the second data at timing of a trailing edge of each clock pulse of the reference clock signal to produce a second data string; appending a data transfer completion indicator to one of the first and second data strings, wherein the one of the first and second data strings is selected depending on which one of the two receiving units is selected as a destination of the data; generating a transfer clock signal from the reference clock signal, wherein the transfer clock signal includes a fixed-level pulse in a period of time corresponding to the data transfer completion indicator; and transfers the one of the first and second data strings followed by the data transfer completion indicator, the other of the first and second data strings, and the transfer clock signal through different signal lines. Each of the two receiving units receives the one of the first and second data strings followed by the data transfer completion indicator, the other of the first and second data strings, and the transfer clock signal; sequentially stores the first data string at timing of a trailing edge of each clock pulse of the transfer clock signal; sequentially stores the second data string at timing of a leading edge of each clock pulse of the transfer clock signal; determines whether the data transfer completion indicator is appended to a predetermined one of the first and second data strings; and reproduces original data from the first and second data strings stored when the data transfer completion indicator is appended to the predetermined one of the first and second data strings.

According to an embodiment of the present invention, the method includes the steps of: at the sending unit, a) dividing the data into odd-numbered data and even-numbered data to store the odd-numbered data and the even-numbered data; b) sequentially reading the odd-numbered data at timing of one edge of leading and trailing edges of each clock pulse of a reference clock signal to produce an odd-numbered data string; c) sequentially reading the even-numbered data at timing of the other edge of leading and trailing edges of each clock pulse of the reference clock signal to produce an even-numbered data string; d) appending a data transfer completion indicator to one of the odd-numbered and even-numbered data strings; e) generating a transfer clock signal composed of the reference clock signal followed by a fixed-level pulse at a timing corresponding to the data transfer completion indicator; and f) transferring the one of the odd-numbered and even-numbered data strings followed by the data transfer completion indicator, the other of the odd-numbered and even-numbered data strings, and the transfer clock signal through respective ones of the three signal lines.

The method further includes the steps of: at the receiving unit, g) receiving the one of the odd-numbered and even-numbered data strings followed by the data transfer completion indicator, the other of the odd-numbered and even-numbered data strings, and the transfer clock signal; h) sequentially storing the odd-numbered data string in a first memory at timing of the other edge of each clock pulse of the transfer clock signal; i) sequentially storing the even-numbered data string in a second memory at timing of the one edge of each clock pulse of the transfer clock signal; j) determining whether the data transfer completion indicator is appended to a predetermined one of the odd-numbered and even-numbered data strings at a timing corresponding to the data transfer completion indicator; and k) when the data transfer completion indicator is appended to the predetermined one of the odd-numbered and even-numbered data strings at a timing corresponding to the data transfer completion indicator, simultaneously latching the odd-numbered data string stored in the first memory and the even-numbered data stored in the second memory to reproduce original data.

The data transfer completion indicator may be a unipolar pulse.

The sending unit may be connected in common to two receiving units, wherein, in the step (d), the one of the odd-numbered and even-numbered data strings is selected depending on which one of the two receiving units is selected as a destination of the data.

More specifically, the sending unit may be connected in common to a first receiving unit and a second receiving unit, wherein, in the step (d), the odd-numbered data string is selected when the first receiving unit is selected as a destination of the data, and the even-numbered data string is selected when the second receiving unit is selected as a destination of the data.

In this case, the method further includes the steps of: at the first receiving unit, receiving the one of the odd-numbered and even-numbered data strings followed by the data transfer completion indicator, the other of the odd-numbered and even-numbered data strings, and the transfer clock signal; sequentially storing the odd-numbered data string in a first memory at timing of the other edge of each clock pulse of the transfer clock signal; sequentially storing the even-numbered data string in a second memory at timing of the one edge of each clock pulse of the transfer clock signal; determining whether the data transfer completion indicator is appended to the odd-numbered data string at a timing corresponding to the data transfer completion indicator; and when the data transfer completion indicator is appended to the odd-numbered data string at a timing corresponding to the data transfer completion indicator, simultaneously latching the odd-numbered data string stored in the first memory and the even-numbered data stored in the second memory to reproduce original data and, at the second receiving unit, receiving the one of the odd-numbered and even-numbered data strings followed by the data transfer completion indicator, the other of the odd-numbered and even-numbered data strings, and the transfer clock signal; sequentially storing the odd-numbered data string in a third memory at timing of a trailing edge of each clock pulse of the transfer clock signal; sequentially storing the even-numbered data string in a fourth memory at timing of a leading edge of each clock pulse of the transfer clock signal; determining whether the data transfer completion indicator is appended to the even-numbered data string at a timing corresponding to the data transfer completion indicator; and when the data transfer completion indicator is appended to the even-numbered data string at a timing corresponding to the data transfer completion indicator, simultaneously latching the odd-numbered data string stored in the third memory and the even-numbered data stored in the fourth memory to reproduce original data.

According to another embodiment of the present invention, a system for transferring data from a sending unit to a receiving unit through three signal lines, wherein the sending unit includes: a memory for storing the data which are each read in parallel; a first shift register for storing odd-numbered data of the data to sequentially read the odd-numbered data at timing of a trailing edge of each clock pulse of a reference clock signal to produce an odd-numbered data string; a second shift register for storing even-numbered data of the data to sequentially read the even-numbered data at timing of a leading edge of each clock pulse of the reference clock signal to produce an even-numbered data string; a transfer completion indicator generator for generating a data transfer completion indicator to append it to one of the odd-numbered and even-numbered data strings; a transfer clock generator for generating a transfer clock signal composed of the reference clock signal followed by a fixed-level pulse at a timing corresponding to the data transfer completion indicator; and a transfer circuit for transferring the one of the odd-numbered and even-numbered data strings followed by the data transfer completion indicator, the other of the odd-numbered and even-numbered data strings, and the transfer clock signal through respective ones of the three signal lines.

The receiving unit includes: a receiver for receiving the one of the odd-numbered and even-numbered data strings followed by the data transfer completion indicator, the other of the odd-numbered and even-numbered data strings, and the transfer clock signal; a third shift register for sequentially storing the odd-numbered data string in a first memory at timing of a trailing edge of each clock pulse of the transfer clock signal; a fourth shift register for sequentially storing the even-numbered data string in a second memory at timing of a leading edge of each clock pulse of the transfer clock signal; a determiner for determining whether the data transfer completion indicator is appended to a predetermined one of the odd-numbered and even-numbered data strings at a timing corresponding to the data transfer completion indicator; and a latching circuit for simultaneously latching the odd-numbered data string stored in the third shift register and the even-numbered data stored in the fourth shift register to reproduce original data, when the determiner determines that the data transfer completion indicator is appended to the predetermined one of the odd-numbered and even-numbered data strings at a timing corresponding to the data transfer completion indicator.

As described above, first and second data (here, the odd-numbered data and the even-numbered data) obtained by dividing the data can be transferred in parallel using a single clock signal. Therefore, the transfer speed improves without increasing the number of signal lines. More specifically, since the data transfer completion is realized by a combination of the transferred data and a predetermined logic value of the transfer clock in place of the strobe signal, the total required number of signal lines is three, which is the same as that conventionally required.

Further, in the case of two receiving units connected to the sending unit, the sending unit appends a data transfer completion indicator to a selected one of the first and second data strings depending on which one of the two receiving units is selected as a destination of the data. Each receiving unit determines whether the received data strings should be captured, depending on which one of the first and second data strings is followed by the data transfer completion indicator. Therefore, it is possible to transfer the data strings to a selected one of the two receiving units without increasing the number of signal lines.

BRIEF DESCRIPTION OF THE DRAWINGS

FIG. 1 is a block diagram showing a serial data transfer system according to a first embodiment of the present invention;

FIG. 2A is a timing chart showing a sequence of odd-numbered data transferred through a first signal line a as shown in FIG. 1;

FIG. 2B is a timing chart showing a sequence of even-numbered data transferred through a second signal line b as shown in FIG. 1;

FIG. 2C is a timing chart showing a sequence of clock pulses transferred through a third signal line c as shown in FIG. 1;

FIG. 6 is a block diagram showing a serial data transfer system according to a second embodiment of the present invention;

FIG. 7A is a timing chart showing a sequence of odd-numbered data transferred through a first signal line a as shown in FIG. 6;

FIG. 7B is a timing chart showing a sequence of even-numbered data transferred through a second signal line b as shown in FIG. 6;

FIG. 7C is a timing chart showing a sequence of clock pulses transferred through a third signal line c as shown in FIG. 6;

FIG. 8A is a timing chart showing a sequence of data transferred through a data line in a conventional data transfer system;

FIG. 8B is a timing chart showing a clock signal transferred through a clock signal line in the conventional data transfer system; and FIG. 8C is a timing chart showing a strobe signal transferred through a strobe signal line in the conventional data transfer system.

DESCRIPTION OF THE PREFERRED EMBODIMENTS

Preferred embodiments of the present invention will be described hereafter by referring to FIGS. 1–7.

System Configuration

Referring to FIG. 1, a data transfer system according to a first embodiment of the present invention is assumed to be composed of a sending unit 100 and a receiving unit 200, which are connected by three signal lines. The number of signal lines is the same as that of the conventional serial data transfer system. The system as shown in FIG. 1 is different from the conventional system in that odd-numbered data a as shown in FIG. 2A, even-numbered data b as shown in FIG. 2B, and a transfer clock c as shown in FIG. 2C are transferred from the sending unit 100 to the receiving unit 200 in parallel.

The odd-numbered data a transferred from the sending unit 100 changes at each trailing edge of the transfer clock c, and is captured by the receiving unit 200 at each leading edge of the transfer clock c. Further, the even-numbered data b transferred from the sending unit 100 changes at each leading edge of the transfer clock c, and is captured by the receiving unit 200 at each trailing edge of the transfer clock c.

After the sending unit 100 has transferred the last bit D0 of the serial data, the sending unit 100 fixes the signal level of the transfer clock c to HIGH as shown in FIG. 2C. Then, the sending unit 100 causes the odd-numbered data a to go low once after the last odd-numbered data D1 to produce a LOW pulse, which is composed of two pulses during the transfer clock c kept HIGH, as shown in FIG. 2A. Thereafter, when the transfer clock c is kept at the HIGH level during a period from the leading edge to the trailing edge of the odd-numbered data a, the receiving unit 200 latches the captured data a and b. In other words, the receiving unit 200 determines that the transfer clock c kept at the HIGH level indicates the timing of data transfer completion.

As is apparent from FIGS. 2A–2C, it is possible to transfer 8-bit data in six clock pulses of the transfer clock c.

In other words, the data transfer speed is about two times that of the conventional transfer method (see FIGS. 8A–8C). Furthermore, the total number of signal lines required remains three, that is the same as the number of lines required conventionally.

Circuit Configurations

Next, the circuit configurations of the sending unit 100 and the receiving unit 200 will be described in detail.

Figure 3:
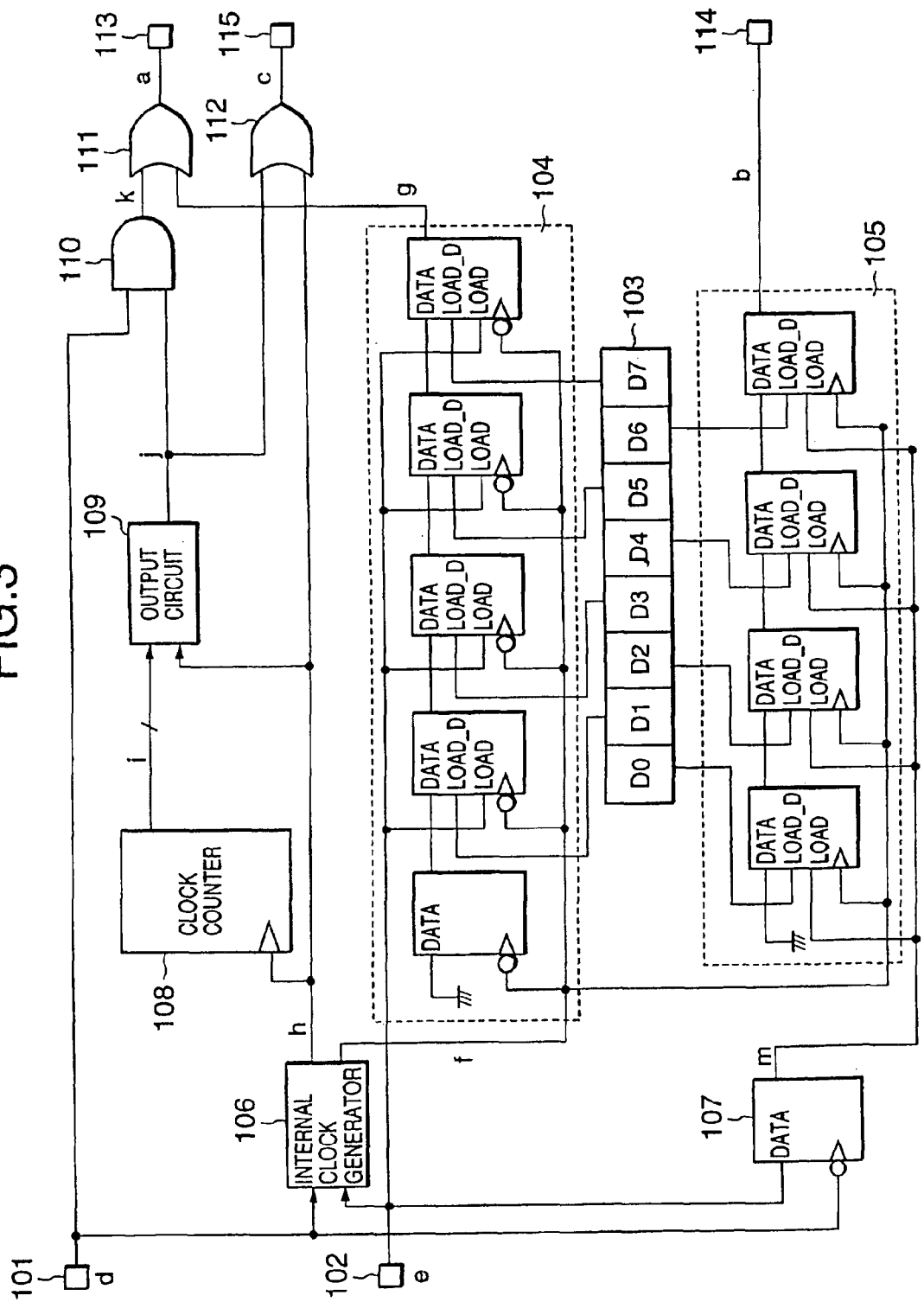
FIG. 3 is a circuit diagram showing a sending unit in the first embodiment.

As shown in FIG. 3, the sending unit 100 includes a system clock input terminal 101, a load signal input terminal 102, a memory 103, a first shift register 104, and a second shift register 105. The memory 103 may be a shift register, which stores data of 8 bits numbered D0 to D7 to be transferred in descending order, the most significant bit D7 first.

The first shift register 104 is composed of flip flops connected in cascade at five stages in this embodiment. The first shift register 104 loads odd-numbered data D7, D5, D3, and D1 in descending order from the memory 103, and shifts them according to the shift clock f.

The second shift register 105 is composed of flip flops connected in cascade at four stages in this embodiment. The second shift register 105 loads even-numbered data D6, D4, D2, and D0 in descending order from the memory 103, and shifts them according to the shift clock f.

The sending unit 100 further includes an internal clock generator 106, a flip flop 107 for generating a load signal m from a load signal e to supply it to the shift register 105, a clock counter 108 for generating a clock count value i, an output circuit 109 for outputting a data output completion signal j, a two-input AND circuit 110 for outputting a gated clock k, a two-input OR circuit 111 for outputting the odd-numbered data a to an output terminal 113, a two-input OR circuit 112 for outputting the transfer clock c to an output terminal 115, and an output terminal 114 to which the even-numbered data b is output.

Figure 4:
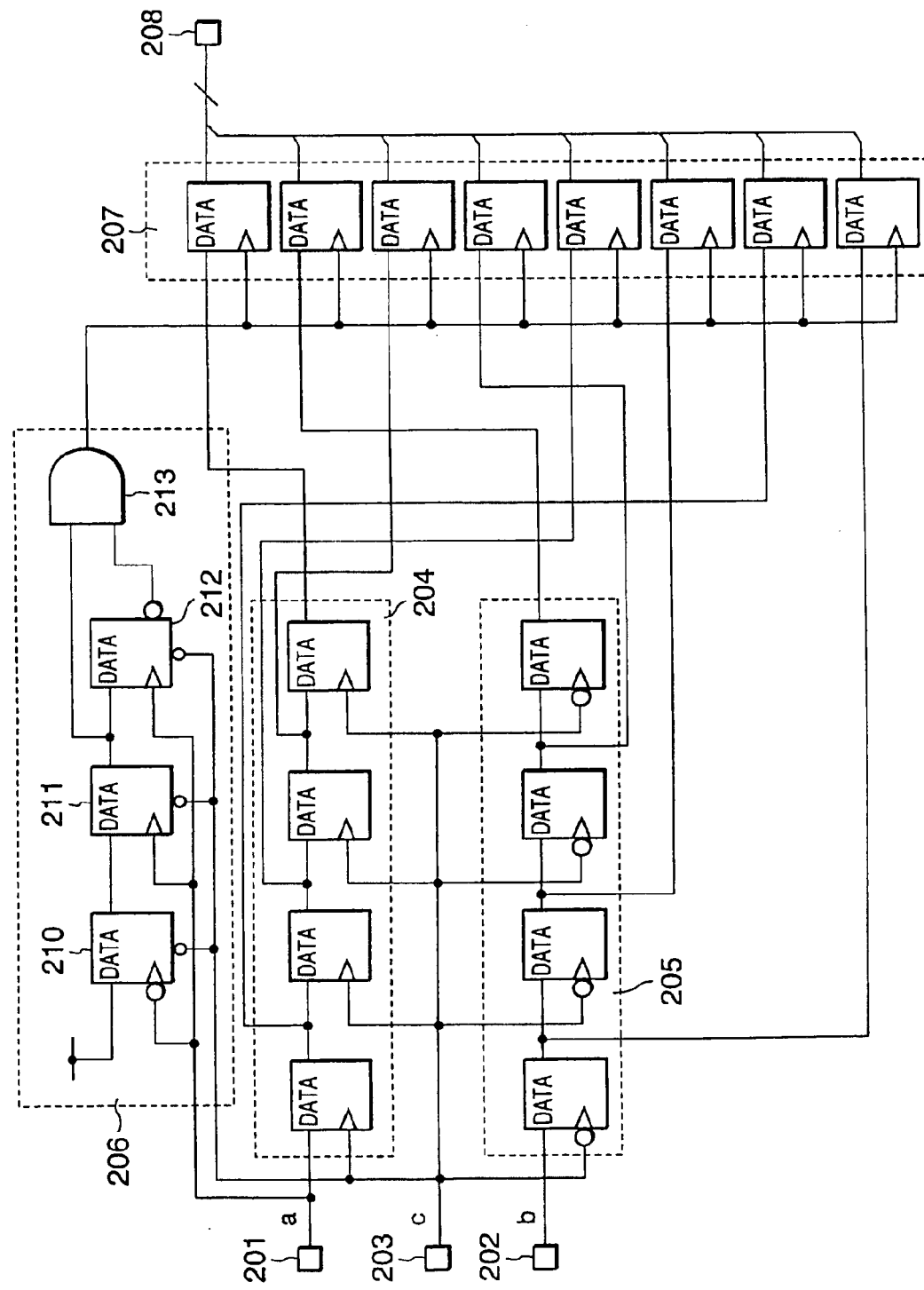
FIG. 4 is a circuit diagram showing a receiving unit in the first embodiment.

As shown in FIG. 4, the receiving unit 200 has an input terminal 201 for receiving the odd-numbered data a from the sending unit 100, an input terminal 202 for receiving the even-numbered data b from the sending unit 100, an input terminal 203 for receiving the transfer clock c from the sending unit 100. The receiving unit 200 includes a first shift register 204 for storing the odd-numbered data a, a second shift register 205 for storing the even-numbered data b, a latch pulse generator 206 for generating a latch pulse, and a latch circuit 207. According to the latch pulse, the latch circuit 207 latches the received serial data stored in the first shift register 204 and the second shift register 205, and outputs the latched data to a terminal 208.

Operation

The operation of the sending unit 100 will be described in detail with reference to the circuit diagram of FIG. 3 and the timing chart of FIG. 5.

Figure 5:
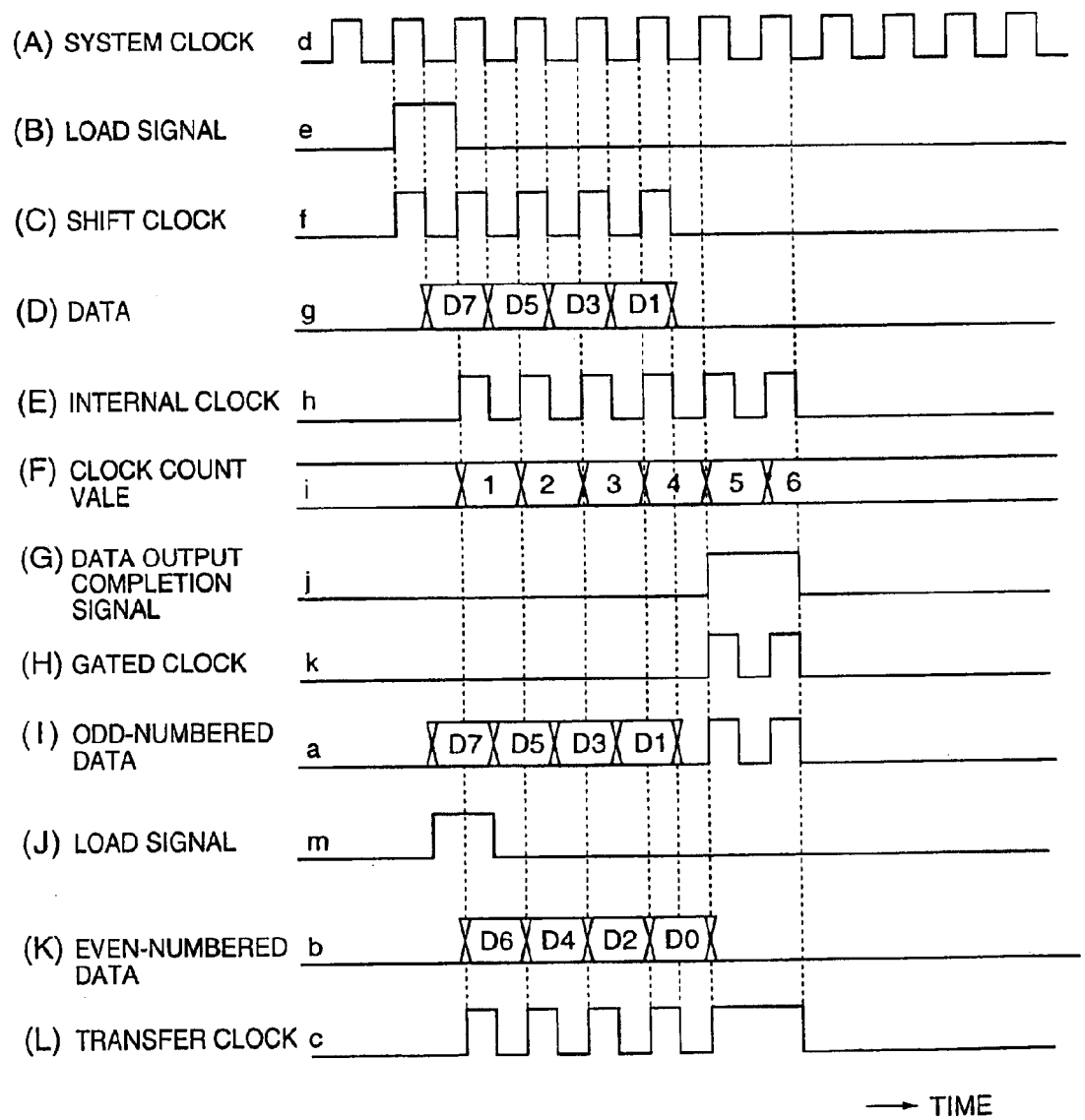
FIG. 5 is a timing chart for explaining the operation of the sending unit as shown in FIG. 3.

As shown in FIG. 5, odd-numbered data D7, D5, D3 and D1 are loaded into the shift register 104 from the memory unit 103 according to the load signal e. This load signal e is a signal that is input via the input terminal 102. Further, according to a load signal m, even-numbered data D6, D4 and D2 are loaded into the shift register 105 from the data string stored in the memory unit 103. This load signal m is a signal that is output by the flip flop 107 delaying the load signal e by one pulse of the system clock d input from the input terminal 101.

The internal clock generator 106 receives the load signal e and the system clock d, and generates a shift clock f. Then, the internal clock generator 106 supplies the shift clock f to the shift register 104 and the shift register 105.

Based on this arrangement, the shift register 104 that is composed of flip flops connected in cascade at five stages shifts the loaded data five times at the timing of the trailing edge of the shift clock f. Then, the shift register 104 serially outputs the odd-numbered 4-bit data D7, D5, D3 and D1 as data g to one input terminal of the OR circuit 111.

Further, the shift register 105 that is composed of flip flops connected in cascade at four stages shifts five times at the timing of the leading edge of the shift clock f. Then, the shift register 105 serially outputs the even-numbered 4-bit data D6, D4, D2 and D0 as the even-numbered data b. This even-numbered data b is sequentially transferred to the receiving unit 200 via the output terminal 114.

The internal clock generator 106 generates six system clock pulses as an internal clock h immediately after the load signal e has gone low, from the system clock d and the load signal e. Then, the internal clock generator 106 outputs this clock h in common to the clock counter 108, the output circuit 109, and the OR circuit 112. The clock counter 108 counts this clock h to output the count value i to the output circuit 109.

The output circuit 109 decodes the count value i and outputs a data output completion signal j that rises at a point of time when the input count value i has become "5" and that falls at a point of time when a pulse of the clock h has fallen after the input count value i became "6". The AND circuit 110 allows the passing of the system clock 101 from the input terminal 101 only when this data output completion signal j is at the HIGH level. In this manner, the AND circuit 110 outputs a gated clock k to the OR circuit 111.

The OR circuit 111 executes an OR operation of this gated clock k and the data g input from the shift register 104 to produce the odd-numbered data a. This odd-numbered data a is sequentially transferred to the receiving unit 200 via the output terminal 113. The OR circuit 112 executes an OR operation of the gated clock k and the clock h input from the internal clock generator 106 to produce the transfer clock c. This transfer clock c is transferred to the receiving unit 200 via the output terminal 115.

Next, the operation of the receiving unit 200 will be described in detail with reference to FIG. 4.

Referring to FIG. 4, the odd-numbered data a is sequentially input to the shift register 204 via the input terminal 201. The shift register 204 captures the data at a timing of the leading edge of the transfer clock c that is input via the input terminal 203.

Further, the even-numbered data b is sequentially input to the shift register 205 via the input terminal 202. The shift register 205 captures the data at a timing of the trailing edge of the transfer clock c.

In the latch pulse generator 206, flip flops 210, 211 and 212 that are connected in cascade at three stages are reset at a timing of the trailing edge of the transfer clock c. When the transfer clock c is at HIGH level, the flip flop 210 captures data on its input terminal and the respective flip flops 212 and 213 capture data on their input terminals, at the timing of the trailing edge of the odd-numbered data a that has been input at the input terminal 201.

Therefore, the respective flip flops 210 to 212 are reset by the transfer clock c immediately before completing the transfer of the last bit D1 of the odd-numbered data a. Thereafter, the transfer clock c is held at HIGH level as described before. The flip flop 210 captures the HIGH level at the timing of the trailing edge of the odd-numbered data a in such a state that the HIGH-level signal has been input to one input terminal of the AND circuit 213 from the flip flop 212. At the timing of the leading edge of the continuing odd-numbered data a, the flip flop 211 captures the HIGH-level output from the flip flop 210. Then, the HIGH-level output from the flip flop 211 is input to the other input terminal of the AND circuit 213.

As a result, when the odd-numbered data a goes low and then goes high during a period while the transfer clock c is at HIGH level, that is, when the transfer of the last bit D1 of the odd-numbered data a has been completed, a pulse of positive polarity is obtained such that the output of the AND circuit 213 goes high and then goes low when the odd-numbered data a goes low again. The positive polarity pulse is output to the latch circuit 207 as a latch pulse.

The latch circuit 207 receives in parallel the output data D0, D2, D4 and D6 from the respective stages of the shift register 204 and the output data D1, D3, D5 and D7 from the respective stages of the shift register 205. At the timing when the latch pulse has been input, the latch circuit 207 latches these data D0 to D7, and outputs the data D0 to D7 to the terminal 208 in parallel as the reception data.

As described above, the system according to the present embodiment-determines whether data transfer is completed, based on a logical combination of the data a and the transfer clock c in place of the strobe signal used in the conventional system. Further, the data is transferred using two signal lines. Therefore, as is apparent from FIG. 2, in comparison with the conventional data transfer method as shown in FIGS. 8A–8C, it is possible to increase the data transfer speed to about two times the conventional transfer speed by using the same three signal lines.

Another Embodiment

It is possible to select one of a plurality of receiving units depending on which of the odd-numbered data a and the even-numbered data b is followed by the LOW pulse generated during the time period where the transfer clock c is kept high.

Referring to FIG. 6, a system according to a second embodiment of the present invention is assumed to be composed of a sending unit 100 and two receiving units A and B. There are three signal lines between the sending unit 100 and each of the receiving units A and B. The number of signal lines is the same as that of the conventional serial data transfer system. In other words, the three signal lines of the sending unit 100 are connected in common to the receiving units A and B. Therefore, the odd-numbered data a (a'), the even-numbered data b (b'), and the transfer clock c are simultaneously transferred from the sending unit 100 to the receiving units A and B.

In the second embodiment, however, a selected one of the receiving units A and B captures the data transferred by the sending unit 100 depending on which one of the odd-numbered data a (a') and the even-numbered data b (b') has the LOW pulse added thereto.

More specifically, when the LOW pulse is generated at the end of the odd-numbered data a during a period while the transfer clock is kept high at the time of completing the transfer of the serial data (see FIG. 2A and FIG. 5), only the receiving unit A is permitted to capture the transferred data of the odd-numbered data a and the even-numbered data b. The other receiving unit B cannot capture the transferred data. In other words, when the odd-numbered data a is followed by an indicator indicating the completion of data transfer, it is determined that the present data string is destined to the receiving unit A.

On the other hand, when the LOW pulse is generated at the end of the even-numbered data b during a period while the transfer clock is kept high at the time of completing the transfer of the serial data (see FIG. 7B), only the receiving unit B is permitted to capture the transferred data of the odd-numbered data a and the even-numbered data b. The other receiving unit A cannot capture the transferred data. In other words, when the even-numbered data b is followed by an indicator indicating the completion of data transfer, it is determined that the present data string is destined to the receiving unit B. FIGS. 7A–7C show the case where the present data string is destined to the receiving unit B.

In order to cause the receiving units A and B to operate as described above, the receiving unit A is structured in a similar manner to that shown in FIG. 4. The receiving unit B is structured to use the even-numbered data b as the operation clock of the latch pulse generator 206 as shown in FIG. 4. Based on this arrangement, it is possible to distribute the data on the same signal lines to one of the receiving unit A and the receiving unit B.

The present invention is not limited to the above embodiments. In the case of the first embodiment, the completion of the data transfer can be also determined depending on whether a predetermined LOW pulse is added to the even-numbered data b during a period while the transfer clock is kept high. Alternatively, it is also possible to use a HIGH pulse that is an inverted LOW pulse in place of the LOW pulse. In other words, a unipolar pulse may be used as an indicator indicating the data transfer completion.

Further, in the above embodiments, the data transfer is carried out in such a phase relationship that the odd-numbered data a changes at the timing of trailing edge of the transfer clock c, and the even-numbered data b changes at the timing of leading edge of the transfer clock c. However, in place of this phase relationship, it is also possible to transfer data in such a phase relationship that the even-numbered data b changes at the timing of the trailing edge of the transfer clock c, and the odd-numbered data a changes at the timing of the leading edge of the transfer clock c. In this case, it is a matter of course that the receiving unit receives the even-numbered data b at the timing of the leading edge of the transfer clock c, and receives the odd-numbered data a at the timing of the trailing edge of the transfer clock c.

What is claimed is:

1. A method for transferring data from a sending unit to a receiving unit, comprising the steps of:
dividing the data into first data and second data to store the first data and the second data;
sequentially reading the first data at timing of a leading edge of each clock pulse of a reference clock signal to produce a first data string;
sequentially reading the second data at timing of a trailing edge of each clock pulse of the reference clock signal to produce a second data string;
appending a data transfer completion indicator to one of the first and second data strings;
generating a transfer clock signal from the reference clock signal, wherein the transfer clock signal includes a fixed-level pulse in a period of time corresponding to the data transfer completion indicator which indicates the timing of the data transfer completion indicator; and
transferring the one of the first and second data strings followed by the data transfer completion indicator, the other of the first and second data strings, and the transfer clock signal through different signal lines, transferred from the sending unit to the receiving unit in parallel.

2. A method for transferring data from a sending unit to a selected one of two receiving units connected in common to the sending unit, comprising the steps of:
at the sending unit,
dividing the data into first data and second data to store the first data and the second data;
sequentially reading the first data at timing of a leading edge of each clock pulse of a reference clock signal to produce a first data string;
sequentially reading the second data at timing of a trailing edge of each clock pulse of the reference clock signal to produce a second data string;
appending a data transfer completion indicator to one of the first and second data strings, wherein the one of the first and second data strings is selected depending on which one of the two receiving units is selected as a destination of the data;
generating a transfer clock signal from the reference clock signal, wherein the transfer clock signal includes a fixed-level pulse in a period of time corresponding to the data transfer completion indicator;
transferring the one of the first and second data strings followed by the data transfer completion indicator, the other of the first and second data strings, and the transfer clock signal through different signal lines;
at each of the two receiving units,
receiving the one of the first and second data strings followed by the data transfer completion indicator, the other of the first and second data strings, and the transfer clock signal;
sequentially storing the first data string at timing of a trailing edge of each clock pulse of the transfer clock signal;
sequentially storing the second data string at timing of a leading edge of each clock pulse of the transfer clock signal;
determining whether the data transfer completion indicator is appended to a predetermined one of the first and second data strings; and
when the data transfer completion indicator is appended to the predetermined one of the first and second data strings, reproducing original data from the first and second data strings stored.

3. A method for transferring data from a sending unit to a receiving unit through three signal lines, comprising the steps of:
at the sending unit,
a) dividing the data into odd-numbered data and even-numbered data to store the odd-numbered data and the even-numbered data;
b) sequentially reading the odd-numbered data at timing of one edge of leading and trailing edges of each clock pulse of a reference clock signal to produce an odd-numbered data string;
c) sequentially reading the even-numbered data at timing of the other edge of leading and trailing edges of each clock pulse of the reference clock signal to produce an even-numbered data string;

d) appending a data transfer completion indicator to one of the odd-numbered and even-numbered data strings;

e) generating a transfer clock signal composed of the reference clock signal followed by a fixed-level pulse at a timing corresponding to the data transfer completion indicator which indicates the timing of the data transfer completion indicator; and f) transferring the one of the odd-numbered and even-numbered data strings followed by the data transfer completion indicator, the other of the odd-numbered and even-numbered data strings, and the transfer clock signal through respective ones of the three signal lines, transferred from the sending unit to the receiving unit in parallel.

4. The method according to claim 3, further comprising the steps of:

at the receiving unit, g) receiving the one of the odd-numbered and even-numbered data strings followed by the data transfer completion indicator, the other of the odd-numbered and even-numbered data strings, and the transfer clock signal;

h) sequentially storing the odd-numbered data string in a first memory at timing of the other edge of each clock pulse of the transfer clock signal;

i) sequentially storing the even-numbered data string in a second memory at timing of the one edge of each clock pulse of the transfer clock signal;

j) determining whether the data transfer completion indicator is appended to a predetermined one of the odd-numbered and even-numbered data strings at a timing corresponding to the data transfer completion indicator; and k) when the data transfer completion indicator is appended to the predetermined one of the odd-numbered and even-numbered data strings at a timing corresponding to the data transfer completion indicator, simultaneously latching the odd-numbered data string stored in the first memory and the even-numbered data stored in the second memory to reproduce original data.

5. The method according to claim 3, wherein the data transfer completion indicator is a unipolar pulse.

6. The method according to claim 4, wherein the data transfer completion indicator is a unipolar pulse.

7. The method according to claim 3, wherein the sending unit is connected in common to two receiving units, wherein, in the step (d), the one of the odd-numbered and even-numbered data strings is selected depending on which one of the two receiving units is selected as a destination of the data.

8. The method according to claim 3, wherein the sending unit is connected in common to a first receiving unit and a second receiving unit, wherein in the step (d), the odd-numbered data string is selected when the first receiving unit is selected as a destination of the data, and the even-numbered data string is selected when the second receiving unit is selected as a destination of the data.

9. The method according to claim 8, wherein further comprising the steps of:

at the first receiving unit, receiving the one of the odd-numbered and even-numbered data strings followed by the data transfer completion indicator, the other of the odd-numbered and even-numbered data strings, and the transfer clock signal;

sequentially storing the odd-numbered data string in a first memory at timing of the other edge of each clock pulse of the transfer clock signal;

sequentially storing the even-numbered data string in a second memory at timing of the one edge of each clock pulse of the transfer clock signal;

determining whether the data transfer completion indicator is appended to the odd-numbered data string at a timing corresponding to the data transfer completion indicator; and when the data transfer completion indicator is appended to the odd-numbered data string at a timing corresponding to the data transfer completion indicator, simultaneously latching the odd-numbered data string stored in the first memory and the even-numbered data stored in the second memory to reproduce original data, and at the second receiving unit, receiving the one of the odd-numbered and even-numbered data strings followed by the data transfer completion indicator, the other of the odd-numbered and even-numbered data strings, and the transfer clock signal;

sequentially storing the odd-numbered data string in a third memory at timing of a trailing edge of each clock pulse of the transfer clock signal;

sequentially storing the even-numbered data string in a fourth memory at timing of a leading edge of each clock pulse of the transfer clock signal;

determining whether the data transfer completion indicator is appended to the even-numbered data string at a timing corresponding to the data transfer completion indicator; and when the data transfer completion indicator is appended to the even-numbered data string at a timing corresponding to the data transfer completion indicator, simultaneously latching the odd-numbered data string stored in the third memory and the even-numbered data stored in the fourth memory to reproduce original data.

10. A system for transferring data from a sending unit to a receiving unit through three signal lines, wherein the sending unit comprises:

a memory for storing the data which are each read in parallel;

a first shift register for storing odd-numbered data of the data to sequentially read the odd-numbered data at timing of a trailing edge of each clock pulse of a reference clock signal to produce an odd-numbered data string;

a second shift register for storing even-numbered data of the data to sequentially read the even-numbered data at timing of a leading edge of each clock pulse of the reference clock signal to produce an even-numbered data string;

a transfer completion indicator generator for generating a data transfer completion indicator to append it to one of the odd-numbered and even-numbered data strings;

a transfer clock generator for generating a transfer clock signal composed of the reference clock signal followed by a fixed-level pulse at a timing corresponding to the data transfer completion indicator; and a transfer circuit for transferring the one of the odd-numbered and even-numbered data strings followed by the data transfer completion indicator, the other of the odd-numbered and even-numbered data strings, and the transfer clock signal through respective ones of the three signal lines, and the receiving unit comprises:

a receiver for receiving the one of the odd-numbered and even-numbered data strings followed by the data transfer completion indicator, the other of the odd-numbered and even-numbered data strings, and the transfer clock signal;

a third shift register for sequentially storing the odd-numbered data string in a first memory at timing of a trailing edge of each clock pulse of the transfer clock signal;

a fourth shift register for sequentially storing the even-numbered data string in a second memory at timing of a leading edge of each clock pulse of the transfer clock signal;

a determiner for determining whether the data transfer completion indicator is appended to a predetermined one of the odd-numbered and even-numbered data strings at a timing corresponding to the data transfer completion indicator; and a latching circuit for simultaneously latching the odd-numbered data string stored in the third shift register and the even-numbered data stored in the fourth shift register to reproduce original data, when the determiner determines that the data transfer completion indicator is appended to the predetermined one of the odd-numbered and even-numbered data strings at a timing corresponding to the data transfer completion indicator.

11. A system for transferring data from a sending unit to a receiving unit through a plurality of signal lines, wherein the sending unit comprised:

a memory for storing the data which are each read in parallel;

a first shift register for storing odd-numbered data of the data to sequentially read the odd-numbered data at timing of one edge of each clock pulse of a reference clock signal to produce an odd-numbered data string;

a second shift register for storing even-numbered data at timing of the other edge of each clock pulse of the reference clock signal to produce an even-numbered data string;

a transfer completion indicator generator for generating a data transfer completion indicator to append it to one of the odd-numbered and even-numbered data strings;

a transfer clock generator for generating a transfer clock signal composed of the reference clock signal followed by a fixed-level pulse at a timing corresponding to the data transfer completion indicator which indicates the timing of the data transfer completion indicator; and a transfer circuit for transferring the one of the odd-numbered and even-numbered data strings followed by the data transfer completion indicator, the other of the odd-numbered and even-numbered data strings, and the transfer clock signal through respective ones of the plurality of signal lines.

12. A system for transferring data from a sending unit to a receiving unit through a plurality lines, wherein the receiving unit comprise:

a receiver for receiving the one of the odd-numbered and even-numbered data strings followed by the data transfer completion indicator, the other of the odd-numbered and even-numbered data strings, and the transfer clock signal;

a third shift register for sequentially storing the odd-numbered data string in a first memory at timing of one edge of each clock pulse of the transfer clock signal;

a fourth shift register for sequentially storing the even-numbered data string in a second memory at timing of the other edge of each clock pulse of the transfer clock signal;

a determiner for determining whether the data transfer completion indicator is appended to a predetermined one of the odd-numbered and even numbered data strings at a timing corresponding to the data transfer completion indicator; and a latching circuit for simultaneously latching the odd-numbered data string stored in the third shift register and the even-numbered data stored in the fourth shift register to reproduce original data, when the determiner determines that the data transfer completion indicator is appended to the predetermined one of the odd-numbered and even-numbered data strings at a timing corresponding to the data transfer completion indicator.

13. A system comprises:

a sending unit; and a first receiving unit and a second receiving unit, which are connected in common to the sending unit through three signal lines, wherein the sending unit comprises:

a memory for storing the data which are each read in parallel;

a first shift register for storing odd-numbered data of the data to sequentially read the odd-numbered data at timing of a trailing edge of each clock pulse of a reference clock signal to produce an odd-numbered data string;

a second shift register for storing even-numbered data of the data to sequentially read the even-numbered data at timing of a leading edge of each clock pulse of the reference clock signal to produce an even-numbered data string;

a transfer completion indicator generator for generating a data transfer completion indicator to append it to one of the odd-numbered and even-numbered data strings, wherein the data transfer completion indicator is appended to the odd-numbered data string when the first receiving unit is selected as a destination of the data and is appended to the even-numbered data string when the second receiving unit is selected as a destination of the data;

a transfer clock generator for generating a transfer clock signal composed of the reference clock signal followed by a fixed-level pulse at a timing corresponding to the data transfer completion indicator; and a transfer circuit for transferring the one of the odd-numbered and even-numbered data strings followed by the data transfer completion indicator, the other of the odd-numbered and even-numbered data strings, and the transfer clock signal through respective ones of the three signal lines, the first receiving unit comprises:

a first receiver for receiving the one of the odd-numbered and even-numbered data strings followed by the data transfer completion indicator, the other of the odd-numbered and even-numbered data strings, and the transfer clock signal;

a third shift register for sequentially storing the odd-numbered data string in a first memory at timing of a trailing edge of each clock pulse of the transfer clock signal;

a fourth shift register for sequentially storing the even-numbered data string in a second memory at timing of a leading edge of each clock pulse of the transfer clock signal;

a first determiner for determining whether the data transfer completion indicator is appended to the odd-numbered data string at a timing corresponding to the data transfer completion indicator; and a first latching circuit for simultaneously latching the odd-numbered data string stored in the third shift register and the even-numbered data stored in the fourth shift register to reproduce original data, when the first determiner determines that the data transfer completion indicator is appended to the odd-numbered data string at a timing corresponding to the data transfer completion indicator, and the second receiving unit comprises:

a second receiver for receiving the one of the odd-numbered and even-numbered data strings followed by the data transfer completion indicator, the other of the odd-numbered and even-numbered data strings, and the transfer clock signal;

a fifth shift register for sequentially storing the odd-numbered data string in a first memory at timing of a trailing edge of each clock pulse of the transfer clock signal;

a sixth shift register for sequentially storing the even-numbered data string in a second memory at timing of a leading edge of each clock pulse of the transfer clock signal;

a second determiner for determining whether the data transfer completion indicator is appended to the even-numbered data string at a timing corresponding to the data transfer completion indicator; and a second latching circuit for simultaneously latching the odd-numbered data string stored in the fifth shift register and the even-numbered data stored in the sixth shift register to reproduce original data, when the second determiner determines that the data transfer completion indicator is appended to the even-numbered data string at a timing corresponding to the data transfer completion indicator.

* * * * *